US006822505B1

(12) United States Patent
Palaskas et al.

(10) Patent No.: US 6,822,505 B1
(45) Date of Patent: Nov. 23, 2004

(54) MOBILITY COMPENSATION IN MOS INTEGRATED CIRCUITS

(75) Inventors: George Palaskas, New York, NY (US); Shanthi Y. Pavan, Piscataway, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/472,702

(22) Filed: Dec. 27, 1999

(51) Int. Cl.$^7$ .............................. H03B 1/00; H03K 5/00
(52) U.S. Cl. ...................................... 327/551; 330/259
(58) Field of Search ................................ 327/551, 552, 327/553, 554, 52, 53, 54, 63, 65–67, 77, 87, 89, 560–563; 330/259, 254, 261

(56) References Cited

U.S. PATENT DOCUMENTS

| | | | | |
|---|---|---|---|---|
| 4,462,002 A | * | 7/1984 | Schade, Jr. .................. | 330/259 |
| 4,959,622 A | * | 9/1990 | Kearney ..................... | 330/259 |
| 5,394,112 A | * | 2/1995 | Alini et al. .................. | 330/256 |
| 5,471,169 A | * | 11/1995 | Dendinger .................... | 327/67 |
| 5,530,399 A | * | 6/1996 | Chambers et al. .......... | 327/561 |
| 5,751,183 A | * | 5/1998 | Lee ............................ | 327/538 |
| 6,111,467 A | * | 8/2000 | Luo ............................ | 327/554 |

OTHER PUBLICATIONS

R. Zele, D. Allstot, "Low power continuous–time filters", *IEEE Journal of Solid State Circuits*, vol. 31, No. 2, Feb. 1996, pp. 157–168.

S. Venkatraman, S. Natarajan, K. R. Rao, "A new tuning scheme for continuous time filters", *International Conference on VLSI design*, 1997.

* cited by examiner

Primary Examiner—My-Trang Nu Ton
(74) Attorney, Agent, or Firm—Wade James Brady, III; Frederick J. Telecky, Jr.

(57) ABSTRACT

A transconductance-setting circuit (10, 20) and method. The circuit (10, 20) includes a first transconductor (14) coupled to a reference voltage ($V_{ref}$) adapted to produce a current output ($I_{bias}$). A reference current source ($I_{ref}$) is coupled to the first, transconductor (14), and a feedback loop (16) is coupled to the first transconductor (14) and the reference current source ($I_{ref}$). The feedback loop (16) is adapted to reduce error in the current output (2i) and set the transconductance $g_m$ of the first transconductor (14) to a value proportional to the ratio of the reference current and the reference voltage. An auxiliary transconductor (22) is coupleable to the first transconductor (14), and control circuitry (30, 40) is adapted to control the coupling of the auxiliary transconductor (22) to the first transconductor (14) based on the current output (2i). The method includes the steps of applying a reference voltage ($V_{ref}$) to the first transconductor (14), comparing the current output (2i) from the first transconductor (14) to the reference current $I_{ref}$, and setting the difference between the first transconductor (14) output current (2i) equal to the reference current $I_{ref}$ with the feedback loop (16).

14 Claims, 5 Drawing Sheets

MOBILITY COMPENSATION IN MOS INTEGRATED CIRCUITS

TECHNICAL FIELD OF THE INVENTION

The present invention is generally related to analog circuits, and more particularly to a circuit and method for setting the transconductance of a transconductor.

BACKGROUND OF THE INVENTION

MOS (metal oxide semiconductor) is a widely used semiconductor technology having relatively low power requirements, making it particularly attractive for use in battery-powered devices, such as cellular phones and portable computers, for example. In MOS technology, the speed of a transistor is related to the mobility of the electrons in the channel of the transistor. Mobility is a physical constant that depends on the temperature. For a 100 degree C degree variation in temperature, mobility can decrease by as much as a factor of 2, for example. This places a large constraint on circuit designers, who must design circuits that operate over a wide range of temperatures.

As an example, filters are frequency-selective circuits capable of passing to the output only those input signals that reside in a desired range of frequencies. Filters are particularly sensitive to temperature changes because they are tuned to operate over a certain range of frequencies.

What is needed in the art is a circuit and method for solving the prior art problem of mobility variations in filter circuits resulting from changes in temperature.

SUMMARY OF THE INVENTION

The present invention achieves technical advantages as a circuit and method for setting the transconductance of a differential transistor pair of a transconductor to a specific value, regardless of temperature, while maintaining the gate overdrive of the differential transistor pair within a specific range to optimize performance.

In one embodiment, disclosed is a transconductance-setting circuit, including a first transconductor coupled to a reference voltage and adapted to produce a current output. A reference current source is coupled to the first transconductor, and a feedback loop is coupled to the first transconductor and the reference current source. The feedback loop is adapted to reduce error in the current output and set the transconductance of the first transconductor to a value proportional to the ratio of the reference current and the reference voltage.

Also disclosed is an input filter stage, including a first transconductor coupled to a reference voltage and adapted to produce a current output. A reference current source is coupled to the first transconductor, and a feedback loop is coupled to the first transconductor and the reference current source, where the feedback loop is adapted to reduce error in the current output and set the transconductance of the first transconductor to a value proportional to the ratio of the reference current and the reference voltage.

Further disclosed is a method of setting the transconductance of a first transconductor. The first transconductor is driven by a reference voltage, and is coupled to a current reference and a feedback loop. The method includes the steps of applying the reference voltage to the first transconductor, comparing the current output from the first transconductor to the reference current, and setting the difference between the first transconductor current equal to the reference current with the feedback loop.

The present invention provides a temperature-independent constant transconductance with tight tolerancing of the gate overdrive voltage range. The tuning scheme of the present invention is robust and very accurate, with transconductance errors of less than +/−0.2% being achieved. The transconductance of a differential transistor pair remains constant regardless of process variations and is also useful in the design of constant gain-bandwidth-product op-amps. The invention works well in any technology, and is particularly useful for mixed signal or analog circuits.

BRIEF DESCRIPTION OF THE DRAWINGS

In the drawings, which form an integral part of the specification and are to be read in conjunction therewith.

Like numerals and symbols are employed in different figures to designate similar components in various views unless otherwise indicated.

DETAILED DESCRIPTION OF PREFERRED EMBODIMENTS

The present invention comprises setting the transconductance of a transconductor to overcome temperature and process variations that can impair the transconductor performance.

Figure 1:
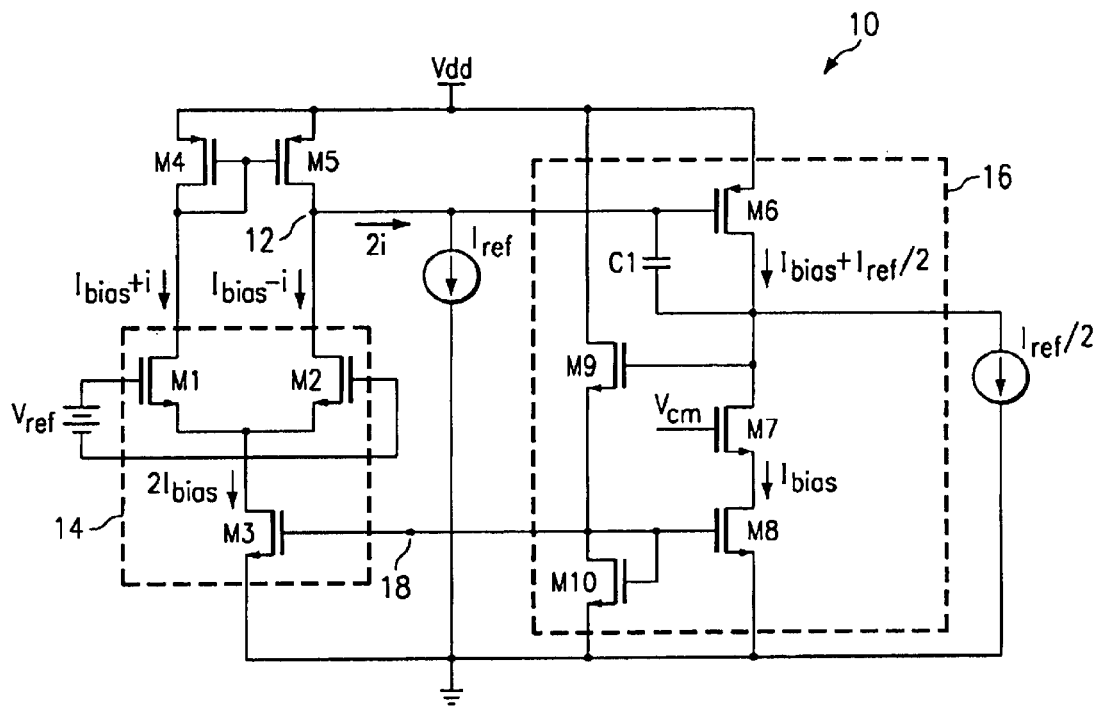
FIG. 1 illustrates the transconductance ($g_m$)-setting circuit 10 of the present invention.

The transconductance-setting circuit 10 of the present invention is shown generally in FIG. 1. Transconductor 14 preferably comprises a differential transistor pair M1 and M2 driven by a voltage $V_{ref}$. Transistors M1 and M2 preferably comprise identical NMOS transistors. The sources of transistors M1 and M2 are coupled to a transistor M3 that acts as a current source for transistors M1 and M2. The drain of transistor M1 is coupled to the drain of transistor M4, which preferably comprises a PMOS transistor. Similarly, the drain of transistor M2 is coupled to the drain of transistor M5, which preferably comprises a PMOS transistor. Transistors M4 and M5 are powered by voltage Vdd and are coupled at their gates to the transistor M1 drain.

Transistors M6, M7, M8, M9 and M10 comprise a feedback loop 16 coupled to the transconductor 14, comprising transistors M1, M2 and M3 as shown. Transistor M6 preferably comprises a PMOS transistor, and transistors M7, M8, M9 and M10 preferably comprise NMOS transistors. The source of transistor M6 and drain of transistor M9 are coupled to voltage source Vdd. The gate of transistor M6 is coupled to the drain of transistor M2 and feed-forward current source $I_{ref}$. The drain of transistor M6 is coupled to the gate of transistor M9 and the drain of transistor M7. Transistor M7 is driven at the gate by voltage $V_{cm}$ which is the common mode voltage of transistors M1 and M2, and is equal to the average of the gate potentials of transistors M1 and M2. The source of transistor M7 is coupled to the drain of transistor M8. Transistor M9 source is coupled to transistor M10 drain, transistor M8 gate and transistor M3 gate. The sources of transistors M8 and M10 are coupled to a return voltage.

The transconductance $g_m$ is defined as a proportionality constant that is a function of the output signal current component and the instantaneous input voltage of a transconductor. In accordance with the present invention, the transconductance $g_m$ of differential transistor pair M1 and M2 is set by applying an input voltage of value $V_{ref}$ at the input of the transistor pair M1 and M2, and comparing the output current 2i that is produced in response to $V_{ref}$ with a reference current $I_{ref}$. The difference, or error, is amplified and fed back at node 18 to control the transconductance value $g_m$ of the differential transistor pair M1 and M2, by changing the tail current $2I_{bias}$ through transistor M3 of the transistor pair M1 and M2.

With a tail current of $2I_{bias}$ for the differential transistor pair M1 and M2 that flows through transistor M3, the currents through M1 and M2 are equal to $(I_{bias}+i)$ and $(I_{bias}-i)$, respectively, with:

$$i = g_m \frac{V_{ref}}{2} \quad \text{Equation 1:}$$

where $g_m$ is the transconductance of transistors M1 and M2. Next, assuming that the PMOS load comprising transistors M4 and M5 is ideal, and calculating Kirchoff's Current Law (KCL) at the drain of transistor M5 at node 12, results in:

$$I_{ref}=2i \quad \text{Equation 2:}$$

thus:

$$g_m = \frac{I_{ref}}{V_{ref}} \quad \text{Equation 3:}$$

Therefore, advantageously, the present invention forces the transconductance $g_m$ of the transistors M1 and M2 to a constant value equal to $I_{ref}/V_{ref}$ that is independent of temperature and process variations.

Transistor M6 is adapted to sense the difference between currents $I_{ref}$ and 2i, amplify the difference, and feed the difference back through transistors M7 and M8 at node 18. Transistors M9 and M10 act as a buffer for the operation of the cascoded M7 and M8 transistor pair. The feedback of feedback loop 16 is negative if $V_{ref}$ has a positive value so that any change in the $2I_{bias}$ tail current affects the current $(I_{bias}+i)$ through transistor M1 more than the current $(I_{bias}-i)$ through transistor M2.

The $I_{ref}/2$ current source connected at the drain of transistor M6 is adapted to equate the drain voltages of transistors M4 and M5. This is achieved by equating the gate-source voltages of transistors M4 and M6, which dramatically improves the performance of the active load M4 and M5 which improves the accuracy of the tuning of the transconductance $g_m$ of transistors M1 and M2 at negligible cost.

In the above calculations, no assumption has been made regarding the exact expression for the transconductance $g_m$ of the MOS differential devices comprising transistors M1 and M2. The circuit 10 is effective even when the square law model for the MOS device fails, for example, when the length of the device is very small. The transconductance-setting circuit 10 can be used for any type of transconductor, for example, it would be effective if the MOS differential transistors M1 and M2 comprise other technologies, such as bipolar transistors. This is advantageous over prior art tuning strategies that are dependent on the square law model.

Figure 2:
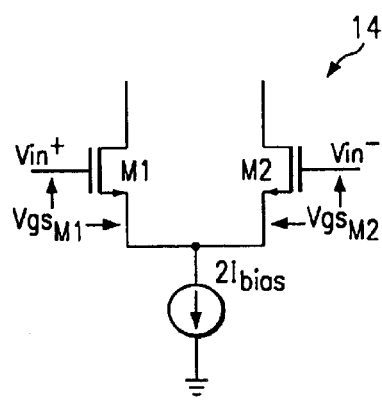
FIG. 2 shows the transconductor 14 comprising a differential transistor pair M1 and M2 of the circuit 10 of FIG. 1.

FIG. 2 illustrates the MOS transconductor 14 of the present invention comprising a differential transistor pair M1 and M2. The transconductance $g_m$ of the differential transistor pair M1 and M2 is equal to the transconductance of either M1 or M2, which, in turn, is given by the following equation, valid in strong inversion-saturation:

$$g_m = \frac{W}{L} \frac{\mu C_{ox}}{\alpha} V_{GST} \quad \text{Equation 4:}$$

where W is the physical transistor width, L is the physical transistor length, $\mu$ is the mobility, $C_{ox}$ is transistor gate capacitance per unit area, alpha is process-dependent contstraint that typically varies from 1.0 to 1.2, and $V_{GST}=(V_{GS}-V_T)$ is the gate overdrive of transistor M1 or M2. Voltage $V_T$ refers to the threshold voltage at which transistor M1 or M2 turns on, and $V_{GS}$ is the gate-source voltage ($V_{GSM1}$ or $V_{GSM2}$). The above expression is reasonably accurate if the lengths L of the transistors M1 and M2 are not very small, e.g. L>0.25 microns, for example, which is usually the case in analog circuits.

A problem with MOS circuit designs is that as temperature increases, the mobility $\mu$ reduces according to the following formula:

$$\mu(T) = \mu(T_r)\left(\frac{T}{T_r}\right)^{-k3} \quad \text{Equation 5:}$$

where T is the absolute temperature, $T_r$ is room absolute temperature, and $k_3$ is a constant which, for CMOS technology simulation results of for the present invention, has been estimated to be $k_3=1.84$.

If the transconductance $g_m$ of the differential transistor pair M1 and M2 is to remain constant, then $V_{GST}$ must increase with temperature to compensate for the mobility reduction. However, a large $V_{GST}$ is problematic because then the available voltage swing at the output of the transconductor 14 is severely restricted. On the other hand, a very small $V_{GST}$ is also undesirable, because then the linearity of the transconductor 14 suffers.

For the present invention, it is preferable that the $V_{GST}$ range be approximately 300 mV–480 mV, for temperatures ranging from −25° C. to 125° C., for example. Using Equation 5, it can be shown that a method of achieving this requirement is by changing the width and length W/L of the transistors M1 and M2. However these physical values of transistors M1 and M2 are fixed.

Figure 3:
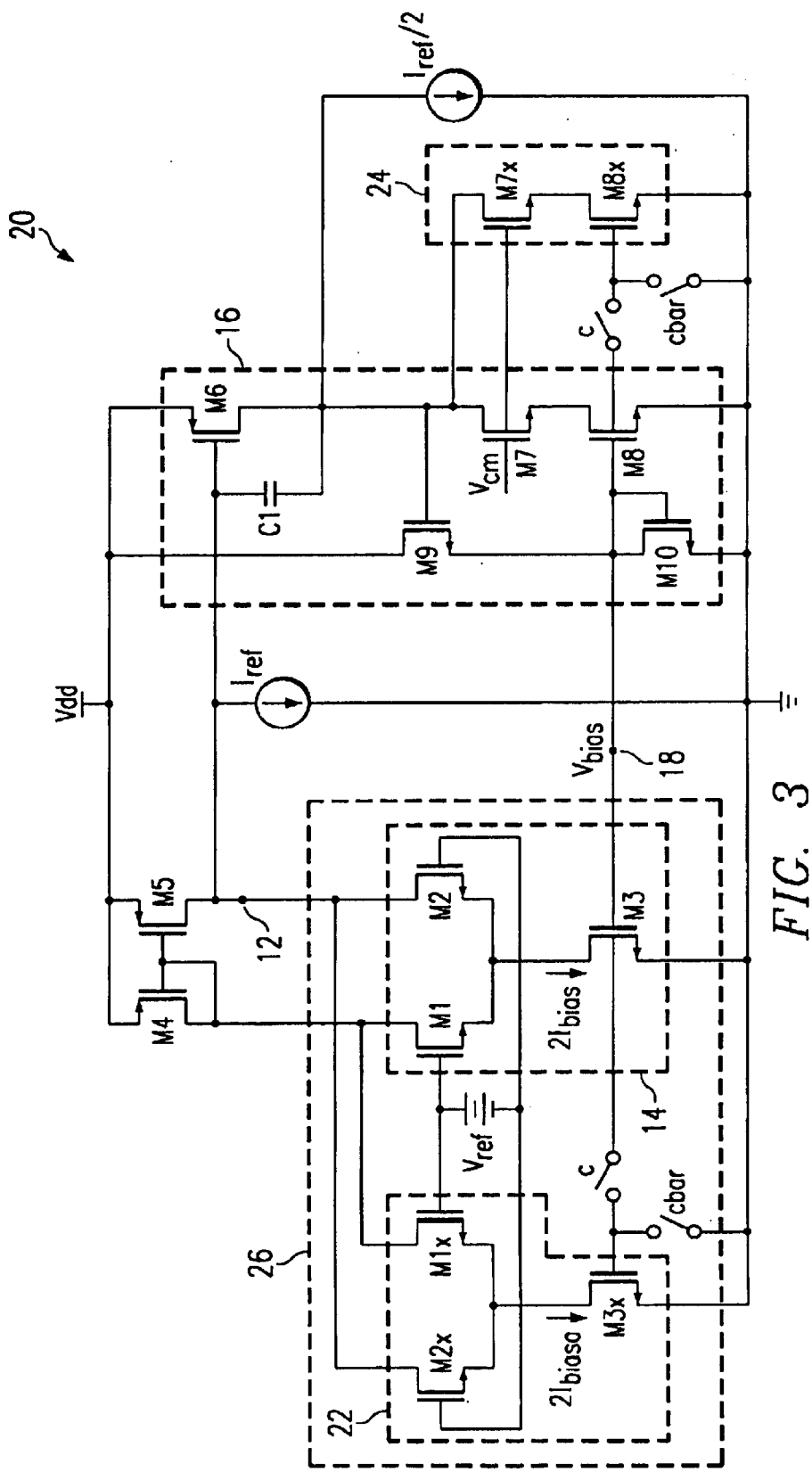
FIG. 3 illustrates an embodiment of the present invention having an auxiliary differential transistor pair M1x and M2x, and auxiliary feedback transistors M7x and M8x.

Varying the width and length W/L is accomplished in an embodiment of the present invention shown in the circuit 20 of FIG. 3 with at least one auxiliary transconductor 22 coupled in parallel to transconductor 14. Auxiliary transconductor 22 preferably comprises a differential transistor pair M1x, M2x of equal values having a width $W_a$, length $L_a$, and transconductance $g_a$. Preferably, auxiliary transconductor 22 includes a transistor M3x coupled to the sources of the differential transistor pair M1x, M2x that supplies the tail current $2I_{biasa}$ for the auxiliary transconductor pair M1x and M2x when the auxiliary transconductor 22 is connected.

When the temperature is high and an unacceptably large $V_{GST}$ is needed, at least one and perhaps a plurality (not shown) of auxiliary transconductors 22 may be turned on, thus making the effective total transconductance $W_T/L_T$ larger, with $W_T/L_T$ being equal to $(W/L+W_a/L_a)$. The circuit 20 then comprises a transconductor 26 that includes auxiliary transconductor 22 and transconductor 14. The circuit 20 includes control circuitry controlling switches "c" and "$c_{bar}$", to be discussed further herein.

By switching the auxiliary transconductor 22 on, a smaller overdrive voltage $V_{GST}$ is needed to support the desired value of total transconductance $g_{mT}$ which is equal to $(g_m+g_{ma})$. Auxiliary feedback loop transistors M7x and M8x are preferably coupled to transistors M7 and M8. The auxiliary transistors M3x and M8x are preferably coupled as shown to switches "c" and "$c_{bar}$" that control the auxiliary transistors M3x, M8x and also M1x, M2x, and M7x.

Although only one set of auxiliary transistor pairs M1x and M2x is shown, preferably a plurality of auxiliary transconductors is similarly coupled to the transconductor 14. The number of the auxiliary transconductors that should be turned on 'on demand' depends on the desired $V_{GST}$ range and is determined by the control circuitry 30 or 40 of FIGS. 4 and 5 to be further discussed herein. The larger the $V_{GST}$ range, the smaller the number of auxiliary transistor pairs. For the 300 mV–480 mV range, only one auxiliary transistor pair is needed, while for a 300 mV–400 mV range, three auxiliary transistor pairs are needed, for example.

Note that there may also be a power dissipation advantage with the use of the present invention. Consider the alternative expression for the transconductance of Equation 6.

$$g_m = \sqrt{\frac{\mu C_{ox} \frac{W}{L} I_{bias}}{a}} \quad \text{Equation 6:}$$

If $g_m$ is to remain constant, then the bias current $I_{bias}$ increases and consequently, the power dissipation increases as the temperature increases. Alternatively, as we see from Equation 6, we may increase W/L and keep the bias current $I_{bias}$ constant. This is what is accomplished with the embodiment shown in FIG. 3, by changing W/L in a discrete way with auxiliary transconductors 22.

Another way to analyze this is by considering a third expression for the transconductance:

$$g_m = \frac{2I_{bias}}{V_{GST}} \quad \text{Equation 7:}$$

From Equation 7, it follows that if the gate overdrive voltage $V_{GST}$ is restricted in a specific range, the bias current $I_{bias}$ and the power dissipation are also restricted in corresponding ranges, because $g_m$ is a constant.

The decision of whether the auxiliary transconductor 22 should be on or off can be based on the total tail current $2I_{biasT}$ that biases the composite transconductor 26, where:

$$2I_{biasT}=2I_{biasa}+2I_{bias} \quad \text{Equation 8:}$$

This follows directly from Equation 7. When the tail current $I_{bias}$ exceeds some specific value such that $V_{GST}$ falls out of range, the auxiliary transconductor 22 is turned on in accordance with the present invention. When the bias current $I_{biasT}$ lies in its allowable range, then the gate overdrive $V_{GST}$ also lies in its allowable range, and the state of the auxiliary transconductor 22 must be preserved.

The plurality of auxiliary transconductors 22 in circuit 20 of FIG. 3 provides the ability to vary the aspect ratio $W_T/L_T$ of the transistors of the transconductors, which is advantageous because this allows the total transconductance $g_{mT}$ to be set and maintained over a wide temperature range. The auxiliary transistor pair M1x and M2x of transconductor 22 is turned on when the control bit "c" is 1, and off when c=0.

Figure 4:
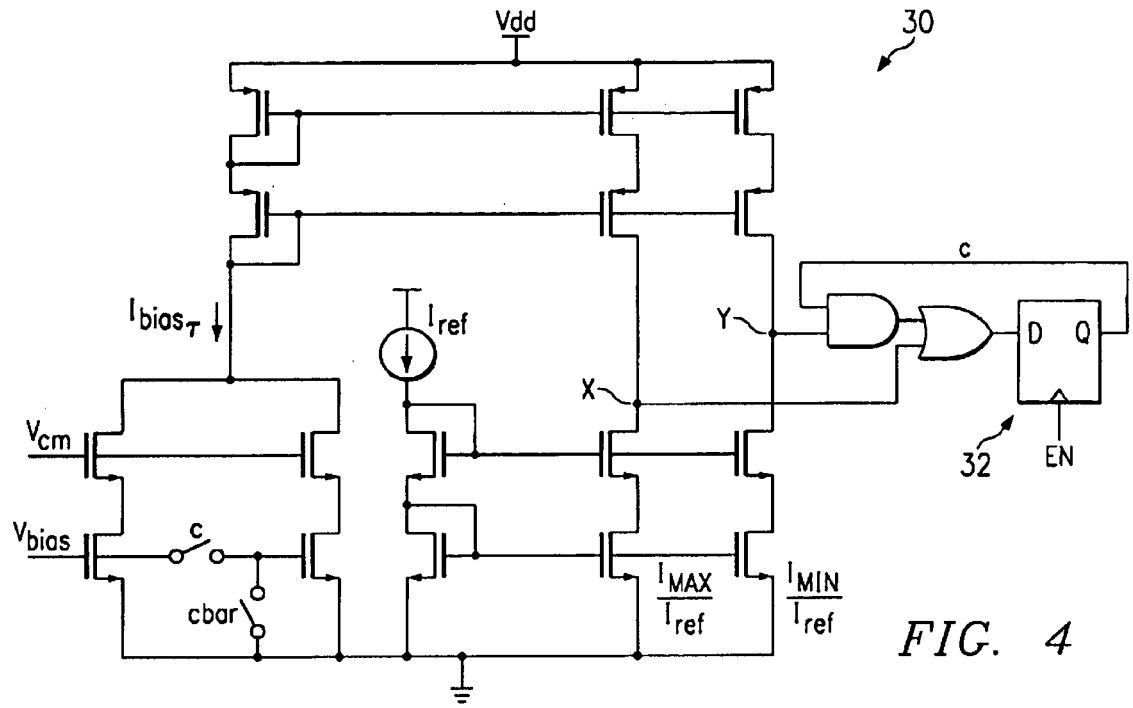
FIG. 4 shows synchronous decision making circuitry for the circuit of FIG. 3.

FIG. 4 depicts preferred circuitry 30 for deciding whether the auxiliary transistor pair M1x and M2x of auxiliary transconductor 22 should be turned on or off, and for storing the value of c. The total current $I_{biasT}$ that biases the composite transconductor 26 is compared with $I_{MAX}$ and $I_{MIN}$ which are mirrored from reference current $I_{ref}$ of circuit 20. Node X will be at voltage $V_{dd}$ when $I_{bias}$ is larger than $I_{MAX}$, and at 0 V otherwise. Similarly, node Y will be at voltage $V_{dd}$ when current $I_{bias}$ is larger than $I_{MIN}$, and at 0V otherwise. If an "out of range" condition for $V_{GST}$ is detected, then at the next positive edge of the control signal called EN (enable), bit "c" will be updated as needed. Preferably, a positive edge-triggered register 32 is used to store the value of "c".

Figure 5:
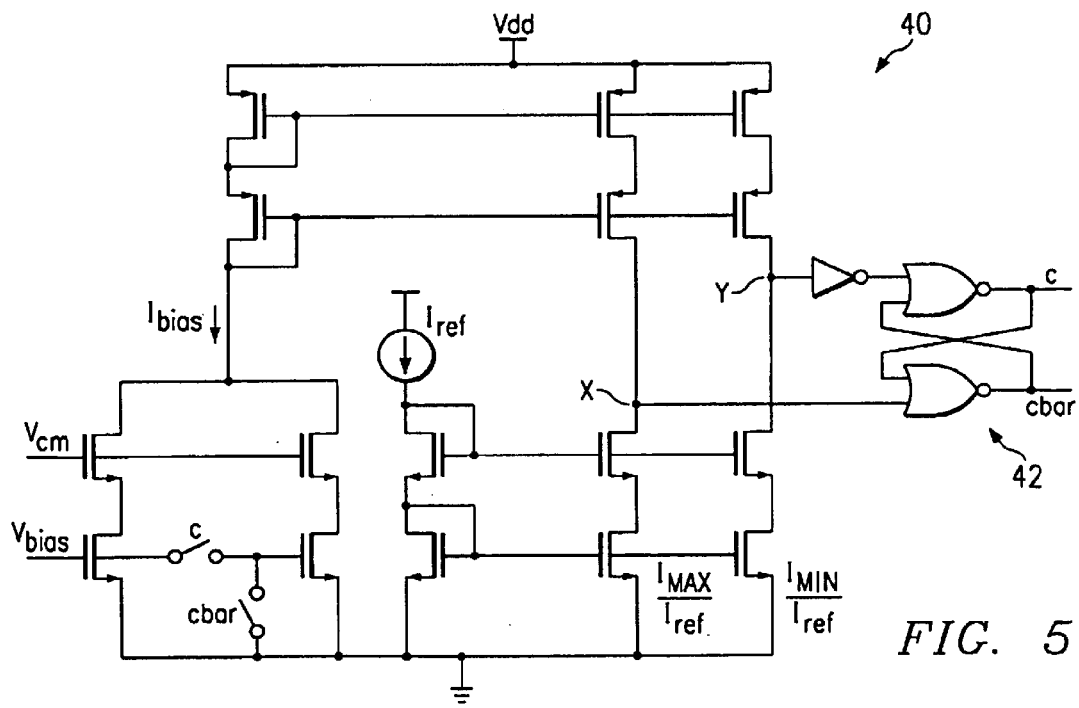
FIG. 5 shows asynchronous decision making circuitry for the circuit of FIG. 3.

The operation performed by the circuit 30 of FIG. 4 can also be performed in an asynchronous way as shown in the circuit 40 of FIG. 5. Here an "out of range" $V_{GST}$ condition sets or resets an SR flip-flop 42 as needed, and no ENable signal is needed. The advantage of this embodiment is that it is self-contained, that is, we do not need external signals to control the operation of the circuit 40. However, this is also a disadvantage, because there is little control on the time when bit "c" will be updated. The update of bit "c" could, for example, undesireously occur while the filter is processing an input signal.

A potential problem with this approach is that the circuit 40 may oscillate if not properly designed. To see how this oscillation may occur, assume that the auxiliary transconductor 22 is off and the temperature rises. At some point, the bias current $I_{bias}$ exceeds $I_{MAX}$ and the auxiliary transistor pair M1x and M2x turns on. The current will "fold" to a value $\gamma I_{MAX}$, where $\gamma$ is (ideally) the ratio of the W of the basic pair over the total W $(W_{M1}+W_{M2}+W_{M1x}+W_{M2x})$ when the auxiliary pair is on. If the $\gamma I_{MAX}$ value falls below $I_{MIN}$, then an "out of range" condition will again be detected, and the auxiliary transistor pair M1x and M2x switches off. The bias current $I_{bias}$ continues increasing until it exceeds $I_{MAX}$ again, and the process will repeat itself.

A method of safeguarding against this circuit behavior is by ensuring that $\gamma I_{MAX}$ is always larger than $I_{MIN}$, in the presence of all practical non-idealities. For example, a threshold voltage $V_T$ mismatch between the transistors that implement the $I_{MAX}$ and $I_{MIN}$ current sources of FIG. 5 should be taken into account, because this can reduce the available safety margin. Using this approach, the control of $V_{GST}$ is traded-off for stability. In order to make $I_{MAX}$ larger than $I_{MIN}$ with a considerable safety margin, the auxiliary transistor pair M1x and M2x must be made smaller. This will reduce the maximum temperature over which the differential transistor pair M1 and M2 meets the $V_{GST}$ specifications.

In the preferred "synchronous" version of the circuit shown in FIG. 4, there is no danger of oscillations. Even if $\gamma I_{MAX}$ goes below $I_{MIN}$ after "c" is updated, this "out of range" condition can only affect "c" on the next EN pulse, and thus, oscillations are avoided. Using this approach, the temperature range over which the $V_{GST}$ specification is met can be maximized. The synchronous circuit 30 of FIG. 4 is preferred because the operation of this embodiment is frequently interrupted by idle periods, ideally suited for the tuning of the transconductance $g_m$.

Next, simulation results for the present invention will be discussed. The circuits 20 and 30 of FIGS. 3 and 4 were designed for a desired transconductance $g_{mT}$ of 900 μA/V and simulated over the temperature range of −25° C. to 125° C. The error in the transconductance $g_m$ value of transistor pair M1 and M2 achieved was ±0.5% without the use of the auxiliary transconductor 22, and the error in the transconductance $g_{mT}$ value of transistor pair M1 and M2 with the use of the auxiliary transconductor achieved was ±0.2%.

Figure 6:
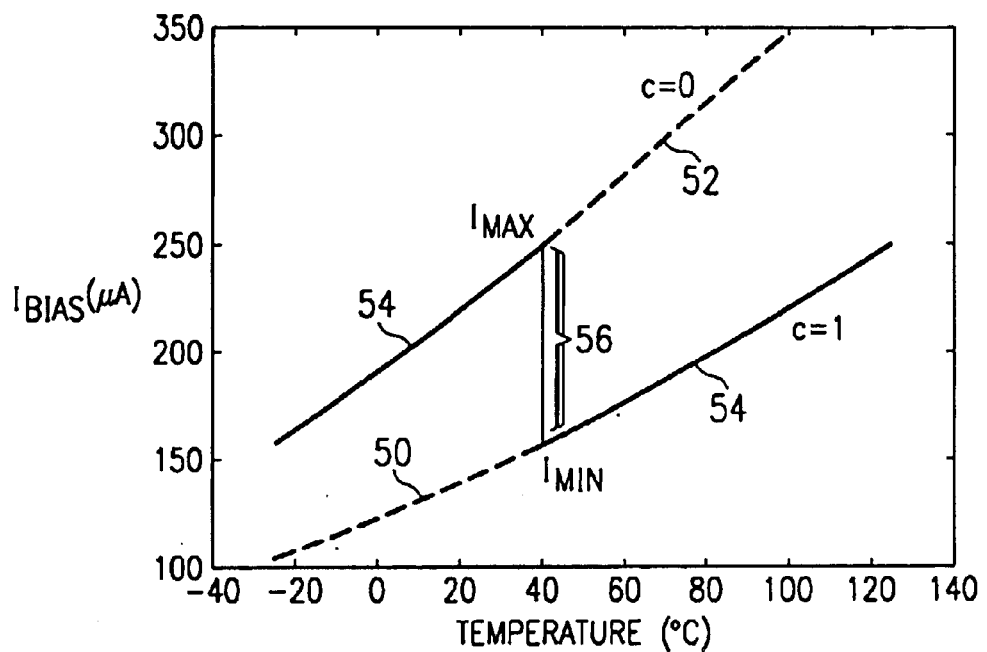
FIG. 6 shows simulation results for the present invention, in particular, bias current variation with temperature.

FIG. 6 shows a graph depicting the total bias current needed to support the desired transconductance $g_{mT}$ value, when the auxiliary differential pair is forced to be on (c=1, signal 50) or off (c=0, signal 52). By using the 'variable W/L' approach provided by switching on the auxiliary transconductor(s) 22 described previously, the overall transconductor 26 bias current $I_{biasT}$ may be set to between $I_{MIN}$ and $I_{MAX}$ by appropriately switching the auxiliary transistor pair on or off. The resultant curve 54 for total bias current $I_{biasT}$ versus temperature is shown by the solid line.

Note that there is a small uncertainty in the switching point where the auxiliary differential pair changes state. The vertical region 56 of signal 54 defining the switching point is effectively a "switching region." This uncertainty is in part deterministic (e.g. a finite resolution in the value of the $I_{MIN}$ and $I_{MAX}$ current sources), and in part stochastic (e.g. offsets in the $I_{MIN}$ and $I_{MAX}$ current sources). More importantly, however, is that any error of this kind will only manifest itself as a slight violation of the overdrive voltage $V_{GST}$ specifications, but will not effect the stability of the circuit 20 (as opposed to the 'asynchronous' approach), nor will it effect the accuracy of the transconductance $g_{mT}$ tuning.

Figure 7:
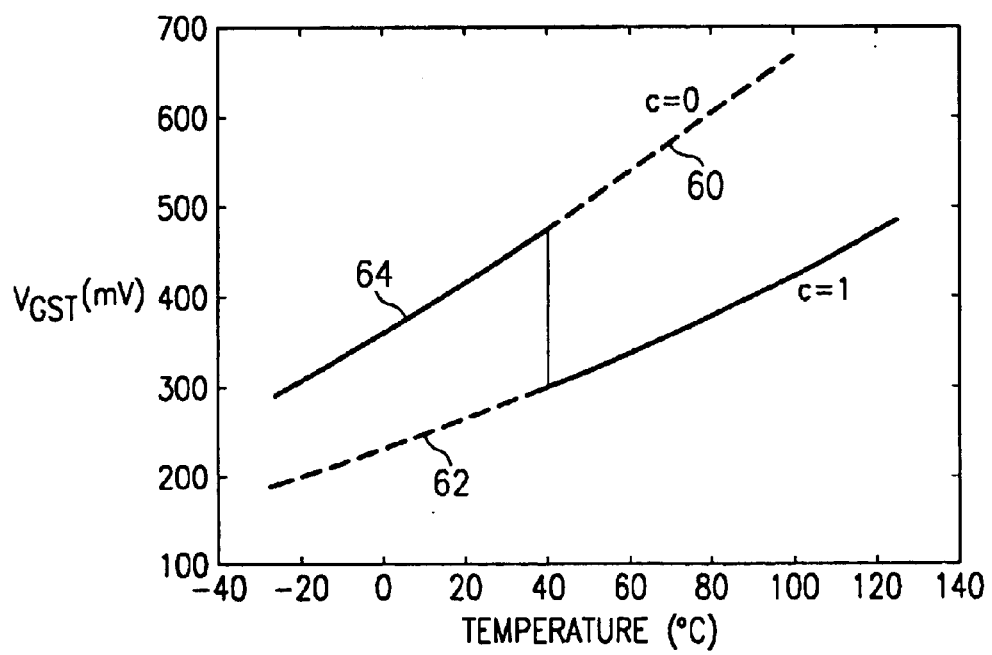
FIG. 7 shows gate overdrive variation with temperature for the present invention.

FIG. 7 shows the gate overdrive $V_{GST}$ at 64 for the transistors M1 and M2 of the differential transistor pair. The upper curve 60 corresponds to c=0 (auxiliary transistor pair M1x, M2x turned off), and the lower curve 62 corresponds to c=1 (auxiliary transistor pair M1x, M2x turned on). Each of these curves 60, 62 alone gives an unacceptably low or high $V_{GST}$ at either low or high temperatures. However, by switching the auxiliary transistor pair M1x, M2x on or off, voltage $V_{GST}$ is maintained in the desired 300 mV–480 mV range for temperatures ranging from −25° C. to 125° C. (signal 64).

Figure 8:
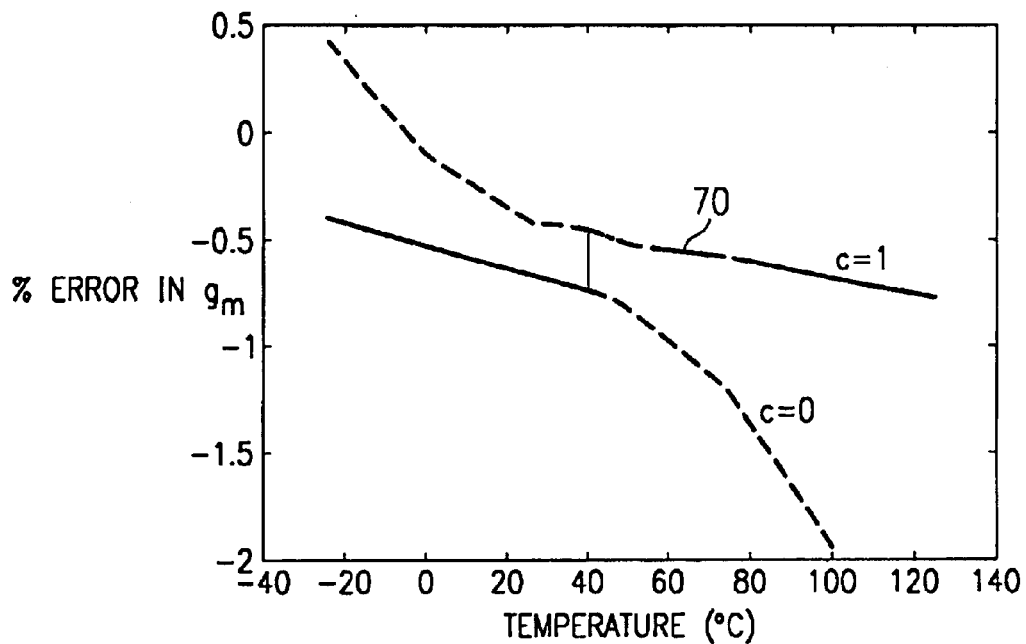
FIG. 8 shows the percentage error in transconductance $g_m$.

FIG. 8 depicts the percentage error at 70 in the value of transconductance $g_m$ achieved by the circuit 20. The circuit 20 behaves very well even without the use of the auxiliary transconductor 22. By having the auxiliary transconductor 22 turned on or off as needed, an error of ±0.2% for all temperatures between −25° C. and 125° C. is achievable in accordance with the present invention.

Figure 9:
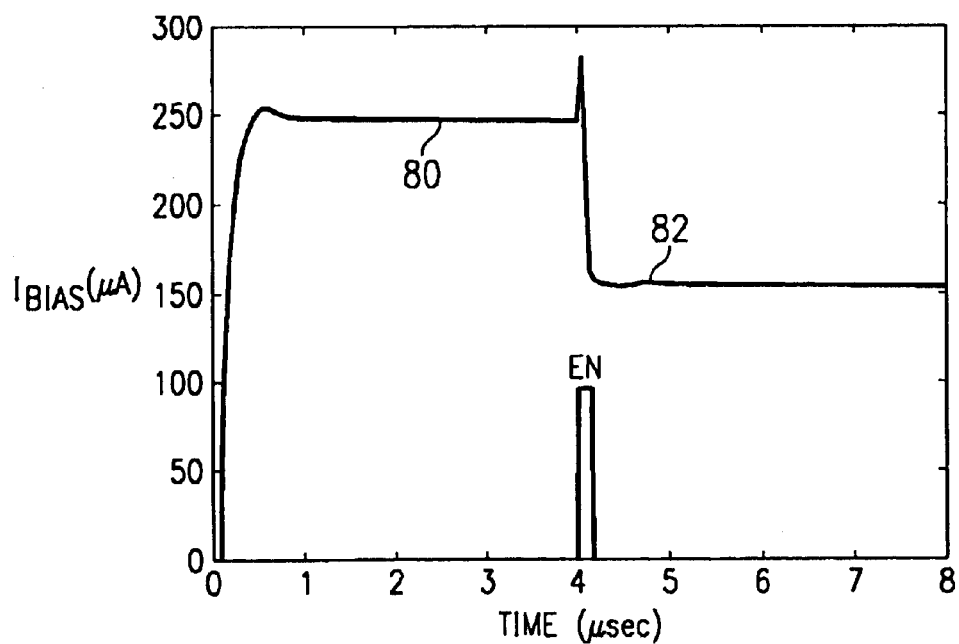
FIG. 9 illustrates the transient behavior of the circuit 20 of FIG. 3.

A plot of the transient behavior of total bias current 80 of circuit 20 is shown in FIG. 9. The simulation was performed at 40° C. which is close to the switching point, and with a 10 pF load at the bias line $V_{bias}$. The compensation capacitor C1 is 5 pF. After the circuit 20 is powered on, the bias current $I_{bias}$ settles to a value larger than $I_{MAX}$, with c=0. When the ENable pulse is received, c is updated to the correct value, and the auxiliary transistor pair M1x, M2x turns on. After a small transient, the bias current $I_{biasT}$ settles again to a constant value at 82. Note that although this new value of $I_{biasT}$ at 82 is slightly below $I_{MIN}$, c will not change until the next ENable pulse.

If the reference current $I_{ref}$ is scaled by a factor of α while keeping everything else the same, the transconductance $g_m$ will be scaled by a factor of a (see Equation 3). Also, the limits of the bias current $I_{MAX}$ and $I_{MIN}$ will scale by a factor α because they are mirrored from $I_{ref}$. The limits of the overdrive voltage $V_{GST}$ remain the same as before, in the range of 300 mV–480 mV (see Equation 7). The problem is that the temperature range over which the circuit meets the $V_{GST}$ specification now moves to lower or higher temperatures, depending on whether α is smaller or larger than unity.

To analyze this, assume that α>1. At −25° C. the $V_{GST}$ needed to support the transconductance $g_m$ will be larger than before because the transconductance $g_m$ is larger itself. The auxiliary pair M1x and M2x turn on at a temperature lower than before, and the c=1 segment of the characteristic curve of FIG. 7 moves to the left, thus reducing the maximum temperature where the overdrive voltage $V_{GST}$ requirement is met. This loss of temperature range is compensated for by an approximately equal gain at low temperatures.

The present invention achieves technical advantages by providing a temperature-independent constant transconductance with tight tolerancing of the gate overdrive voltage range. The tuning scheme of the present invention is robust and very accurate, with transconductance errors of less than +/−0.2% being achieved. The transconductance of the circuit remains constant regardless of temperature and process variations and is useful in many designs, for example, in the design of constant gain-bandwidth-product op-amps. The invention also works well in any technology, and is particularly useful for mixed signal or analog circuits. The invention provides a low-cost method of setting the transconductance $g_m$ of a circuit. The auxiliary transconductors 22 provide a power dissipation advantage by increasing $W_T/L_T$ yet keeping the bias current $I_{biasT}$ constant.

Though the invention has been described with respect to specific preferred embodiments, many variations and modifications will become apparent to those skilled in the art upon reading the present application. For example, the transconductance-setting circuit 10 of the present invention has been described for use with MOS transistors, but may also be used with other technologies such as bipolar transistors, for example. The transconductors described herein comprise differential transistor pairs; however, other transconductor configurations may be used. Certain voltage and temperature ranges are discussed herein as examples, but the present invention may be used to achieve a variety of other $V_{GST}$ voltage ranges for different temperature ranges, for example. The transconductor-setting circuit and of the present invention is useful in many circuit topologies e.g. filters. It is therefore the intention that the appended claims be interpreted as broadly as possible in view of the prior art to include all such variations and modifications.

What is claimed is:

1. A transconductance-setting circuit, comprising:
   a first transconductor coupled to a reference voltage source, said voltage source having a positive terminal and a negative terminal, said first transconductor adapted to produce a current output;
   a reference current sink coupled to said first transconductor, a feedback loop coupled to said first transconductor and said reference current source, said feedback loop adapted to reduce error in said current output and set the transconductance of said first transconductor to a value proportional to the ratio of said reference current and said reference voltage;
   said first transconductor comprising a first differential transistor pair including:
   a first transistor having a gate, source and a drain;
   a second transistor having a gate, source and a drain, said gate of said second transistor coupled to one of said positive or negative terminals of said voltage source and said gate of said first transistor coupled to the other of said positive or negative terminals of said voltage source; and a third transistor coupled to said first and second transistor sources;

said circuit further comprising:

a fourth transistor coupled to said first transistor and a voltage supply; and a fifth transistor coupled to said fourth transistor, said second transistor and said voltage supply;

wherein said feedback loop comprises:

a sixth transistor coupled to said fifth transistor and said current reference source;

a seventh transistor coupled to said sixth transistor and a common mode voltage source; and an eighth transistor coupled to said seventh transistor and said third transistor.

2. The circuit of claim 1 wherein said feedback loop comprises:

a ninth transistor coupled to said seventh transistor and said voltage supply; and a tenth transistor coupled to said eighth transistor and a voltage return.

3. The circuit of claim 2 wherein said first, second, third, seventh, eighth, ninth and tenth transistors comprise NMOS transistors and said fourth, fifth and sixth transistors comprise PMOS transistors.

4. A transconductance-setting circuit, comprising:

a first transconductor coupled to a reference voltage and adapted to produce a current output;

a reference current source coupled to said first transconductor, a feedback loop coupled to said first transconductor and said reference current source, said feedback loop adapted to reduce error in said current output and set the transconductance of said first transconductor to a value proportional to the ratio of said reference current and said reference voltage;

further comprising at least one auxiliary transconductor coupleable to said first transconductor; and control circuitry adapted to control the coupling of said auxiliary transconductor to said first transconductor based on the current output.

5. The circuit of claim 4 wherein said control circuitry comprises a synchronous control circuit.

6. The circuit of claim 4 wherein said auxiliary transconductor comprises a second differential transistor pair, wherein said second differential transistor pair comprises NMOS transistors.

7. An input filter stage having a transconductance, comprising:

a first transconductor coupled to a reference voltage source, said reference voltage source having a positive terminal and a negative terminal, said first transconductor adapted to produce a current output;

a reference current source coupled to said first transconductor; and a feedback loop coupled to said first transconductor and said reference current source, said feedback loop adapted to reduce error in said current output and set said transconductance of said input filter stage to a value proportional to the ratio of said reference current and said reference voltage;

further comprising: at least one auxiliary transconductor coupleable to said first transconductor; and control circuitry adapted to control the coupling of said auxiliary transconductor to said first transconductor based on the current output.

8. The input filter stage of claim 7 wherein said control circuitry comprises a synchronous control circuit.

9. The input filter stage of claim 7 wherein said first transconductor includes a first differential transistor pair comprising:

a first transistor having a gate, source and drain; and a second transistor having a gate, source and drain, said gate of said second transistor coupled to one of said positive or negative terminals of said reference voltage source and said gate of said first transistor coupled to the other of said positive or negative terminals of said reference voltage source.

10. The input filter stage of claim 9 wherein said first transconductor comprises a third transistor coupled to said first and second transistor sources.

11. The input filter stage of claim 10 wherein said circuit comprises:

a fourth transistor coupled to said first transistor and a voltage supply; and a fifth transistor coupled to said fourth transistor, said second transistor and said voltage supply.

12. The input fulter stage of claim 11 wherein said feedback loop comprises:

a sixth transistor coupled to said fifth transistor and said current reference source;

a seventh transistor coupled to said sixth transistor and a common mode voltage source;

an eighth transistor coupled to said seventh transistor and said third transistor;

a ninth transistor coupled to said seventh transistor and said voltage supply; and a tenth transistor coupled to said eighth transistor and a voltage return.

13. The input filter stage of claim 12 wherein said first, second, third, seventh, eighth, ninth and tenth transistors comprise NMOS transistors and said fourth, fifth and sixth transistors comprise PMOS transistor, and said second differential transistor pair comprise NMOS transistors.

14. A method of setting the transconductance of a filter having a first transconductor, said first transconductor adapted to be driven by a reference voltage, said first transconductor being coupled to a current reference and a feedback loop, wherein said method comprises the steps of:

driving said first transconductor with said reference voltage;

comparing the current output from said first transconductor to said reference current; and setting the current difference between said first transconductor equal to the reference current with said feedback loop;

wherein said transconductance is set to a value equal to the ratio of said reference current and said reference voltage;

wherein said filter comprises at least one auxiliary transconductor coupleable to said first transconductor and control circuitry adapted to control said auxiliary transconductor, wherein said method further comprises the steps of: coupling at least one said auxiliary transconductor t said first transconductor based on said current output.

* * * * *